United States Patent [19]
Morris et al.

[11] Patent Number: 6,097,419
[45] Date of Patent: Aug. 1, 2000

[54] OPTICAL CHARACTER GENERATOR FOR AN ELECTROGRAPHIC PRINTER OR COPIER DEVICE

[75] Inventors: Edward Morris, Erding; Josef Eichstetter, Zorneding; Martin Faust, Jetzendorf; Klaus-Dieter Jörgens, Baldham; Gerhard Klapettek, Giessen; Alfons Löw, Obermeitingen; Klaus Pachonik, Taufkirchen, all of Germany

[73] Assignee: Océ Printing Systems GmbH, Poing, Germany

[21] Appl. No.: 08/952,916

[22] PCT Filed: May 13, 1996

[86] PCT No.: PCT/EP96/02037

§ 371 Date: Nov. 24, 1997

§ 102(e) Date: Nov. 24, 1997

[87] PCT Pub. No.: WO96/37862

PCT Pub. Date: Nov. 28, 1996

[30] Foreign Application Priority Data

May 22, 1995 [DE] Germany .............................. 95107809

[51] Int. Cl.[7] ....................................................... B41J 2/47
[52] U.S. Cl. ..................... 347/237; 347/238; 347/247; 347/130
[58] Field of Search ..................................... 347/117, 118, 347/119, 130, 237, 238, 247

[56] References Cited

U.S. PATENT DOCUMENTS 4,443,695  4/1984  Kitamura ................................ 250/205

FOREIGN PATENT DOCUMENTS

| 0 367 550 | 5/1990 | European Pat. Off. . |
| 0 379 303 | 7/1990 | European Pat. Off. . |
| 0 504 575 | 9/1992 | European Pat. Off. . |
| 0 629 508 | 12/1994 | European Pat. Off. . |
| 2 154 776 | 9/1985 | United Kingdom . |
| WO 89/08894 | 9/1989 | WIPO . |

OTHER PUBLICATIONS

Japanese Abstract, vol. 16, No. 347, JP4107888, Sep. 4, 1992.

*Primary Examiner*—N. Le
*Assistant Examiner*—Hai C. Pham
*Attorney, Agent, or Firm*—Hill & Simpson

[57] ABSTRACT

A printer or copier has an optical character generator for reproducing raster image data in grey-scale displays. Integrated light sources in the form of LEDs arranged in arrays are aligned to form a print line. A control IC is provided for each LED array. Groups of the control ICs are formed in which information is shifted for the switch on time of all LEDs of a group starting with the first control IC to the next IC. The ICs are connected together by bonding. A ramp circuit is provided to prevent current surges when the LEDs are switched on. A flat unit that extends along the character generator is used to transmit information and power to the control ICs. Busbars ensure that power is provided to the LEDs.

27 Claims, 5 Drawing Sheets

OPTICAL CHARACTER GENERATOR FOR AN ELECTROGRAPHIC PRINTER OR COPIER DEVICE

BACKGROUND OF THE INVENTION

1. Field of the Invention

The present invention is directed to an optical character generator for an electrographic printer or copier device.

2. Description of the Related Art

Optical character generators have the job of converting print information which is present in the form of electronic data into an optical image with which a photoconductive layer, for example of a photoconductive drum, is then exposed. Subsequently, the exposed image is developed in a known way and, for example, transfer-printed onto paper.

Optical generators that are constructed as a line-like arrangement are advantageous since these work without mechanical movement. Given this type of character generation, an individual, separate light source must be present for every point that is to be image within a line. The number of light sources is thereby very high for example, it may be several 1000). Assuming identical inking of the photoconductive layer all light sources must generally exposed with the same optical energy, so that an optimum quality of the print image is achieved as a result.

The U.S. Pat. No. 4,734,714 discloses an optical character generator with an LED diode array for reproducing black-and-white image information for which a uniform illumination at every picture element is required. The LED arrays are successively arranged in a row on a substrate such that they form a printing line in which a light source is present for each reproducible pixel. Two control modules whose terminals are conducted to the terminals of the LED arrays via interconnects on the substrate are allocated to each LED array. A connection between the interconnect and LED array ensues by bonding. Whereas the one control module is responsible for the drive of the odd-numbered light-emitting diodes, the other control module is responsible for the drive of the even-numbered light-emitting diodes. The control modules contain shift registers into which the 1-bit wide image information can be serially clocked. The output of the shift register of a first control module is connected to the input of a shift register of a second control module, so that data that are written into the first control module can be forwarded to the second as well as to other, following control modules. In order to lower the clock rate upon insertion of the data into the shift register, it is proposed that individual groups of control modules be formed whose shift registers are coupled in the above-described way. In order to set the emitted optical energy of every individual light-emitting diode such that the variation of the emitted optical power of neighboring light-emitting diodes is limited, it is proposed that current-limiting means in the form of resistors or transistors be added to the individual driver components of the control modules.

The image information comprises 1 bit per pixel in the known character generator. More recent applications, however, require character generators that are suitable for the reproduction of gray-scale image information or color image information. Such image information requires pixel that each comprise a plurality of bits. Accordingly, a plurality of bits must be made available in parallel for driving of a single light source.

The European Patent Document EP-A-0 504 575 likewise discloses a character generator with an LED diode array. Due to its type, however, this character generator is hardly suitable for simultaneously representing gray scale information made up of a plurality of bits.

SUMMARY OF THE INVENTION

The present invention is therefore based on the object of providing an optical character generator for an electrographic printer or copier device that enables an image information having a plurality of bits to be delivered fast to every individual light source with high dependability and precision.

This and other objects and advantages of the invention are achieved by an optical character generator for an electrographic printer or copier device, comprising: a plurality of controllable light sources arranged in at least one row, said plurality of controllable light sources being divided into even-numbered and into odd-numbered groups; a plurality of groups of control means for controlling said plurality of controllable light sources; a character generator control connected to said plurality of groups of control means to supply in parallel data comprising a plurality of bits and corresponding to illumination stages of individual ones of said controllable light sources; said plurality of groups of control means being provided both for the even-numbered groups of light sources as well as for the odd-numbered groups of light sources, individual ones of said control means being arranged successively within the groups of control means, an electrical bond connection directly coupled from an output to an input of successively arranged ones of said control means, and a data input connected only to an input of a first successively arranged one of said control means, said data input including: a parallel shift register arrangement whose bit width corresponds to a bit width of the input data, an intermediate memory connected to said parallel shift register arrangement to receive the data in parallel; a carrier on which said plurality of controllable light sources and said control means are arranged; and conductors directly electrically coupling said plurality of controllable light sources and said control means to one another. Developments and embodiments of the invention are provided by the control means which sets an average energy supply for all of the plurality of controllable light sources of a group, and enables an individual control of on time of each of the plurality of controllable light source of a group.

Preferably, the plurality of controllable light sources are light-emitting diodes, the light-emitting diodes being combined in groups as respective LED arrays, the light-emitting diodes being arranged in a row on a rectangular semiconductor chip such that an LED line is formed of a plurality of LED arrays adjoining one another. The LED arrays include sub-groups formed by even-numbered and odd-numbered light-emitting diodes, and ones of the control means are allocated to each of the sub-groups.

In one embodiment, an integrated circuit is provided in which the control means are integrated, the control means including a data memory being a shift register into which data for individual control of on time of each of the controllable light sources is serially written; an intermediate memory into which the data of the data memory is written in parallel; switch means that switch an energy supply of individual ones of the controllable light sources dependent on respective data available in the intermediate memory; and means for setting an average energy supply that are coupled to a further intermediate memory serving as correction value memory. The means for setting an average energy supply includes a digital-to-analog converter that derives a control voltage from a reference voltage dependent on a correction value, a correction value memory of the integrated circuit providing the correction value, and an external resistor connected to convert the control voltage into a control current. The data memory is preferably a shift register that includes an expanded memory location for the correction value for the digital-to-analog converter.

The control means controls the average energy supply dependent on specific boundary conditions.

The optical character generator includes a distributor flat module arranged on the carrier with which the character generator control is coupled to the control means.

A succession of the integrated circuits, such that an output of a respective one of the shift registers is directly electrically coupled by bonding to an input of a successively arranged one of the shift registers, and data are externally supplied only to the shift register of a first of the integrated circuits. Busbars formed as inner layers of the distributor flat module deliver current directly to the integrated circuit.

A busbar on the carrier serves as a ground line for supplying the controllable light sources. The busbar is angled off L-shaped in a direction of its longitudinal extent, and the distributor flat module is glued onto the busbar. The busbar defines at least one recess including a thread, the carrier defining an opening, a screw is guided through the opening of the carrier and screwed into the at least one recess in the busbar.

The control means controls individual on time of each of the controllable light source dependent on a specific luminous intensity of the controllable light source and on a gray scale information that is to be reproduced with the controllable light source.

The data memory includes a plurality of clock-controlled individual memories forming respective groups of successively connected individual memories at least the successively connected individual memories arranged at an input side and an output side changing their status isochronically and the successively connected individual memories respectively lying farther toward an inside then changing their status.

The switch means includes a switchable user parallel to the controllable light sources so that energy supply to the character generator ensues independently of activation of the controllable light sources. The switchable user includes a shunt transistor for each of the controllable light sources, neighboring ones of the shunt transistors being switched offset in time relative to one another.

The optical character generator includes at least two character generators connected to one another module-like. The arrangement of both the light sources as well as the means for control of the light sources on a common carrier enables a direct electrical coupling of the light sources to the control means, as well as a coupling of the means for control to one another. A highly dependable character generator is achieved without requiring additional interconnects to are to be coupled to the light source or, respectively, to the control at each of their ends via a conductor and given minimization of the plurality of coupling points. The space requirement and the realization outlay of a character generator are also lowered together with the reduction in the number of coupling points. Relatively large interconnect widths can be realized which require only a small surface area. This leads to a high quality character generator and to a high yield in the manufacture of the character generator.

As needed, a connection between the character generator control and the character generator can ensue with a flat module. The stiffness thereof required over the entire length of the character generator can be achieved and improved with a specific fashioning of busbars on which the flat module is secured in a specific way, for example by gluing.

It is also especially advantageous to rid the current load of the energy supply of the character generator from undesired noise spikes with a sink, particularly a shunt transistor, that is connected in parallel; to each light source. Given the use of light-emitting diodes as light sources that exhibit a cutoff voltage, the activation and deactivation can be controlled with such an arrangement so that the energy supply to the character generator is temporarily independent of activation of the light sources.

BRIEF DESCRIPTION OF THE DRAWINGS

An example of the invention is explained in greater detail below with reference to the drawing.

DETAILED DESCRIPTION OF THE PREFERRED EMBODIMENTS

Figure 1:
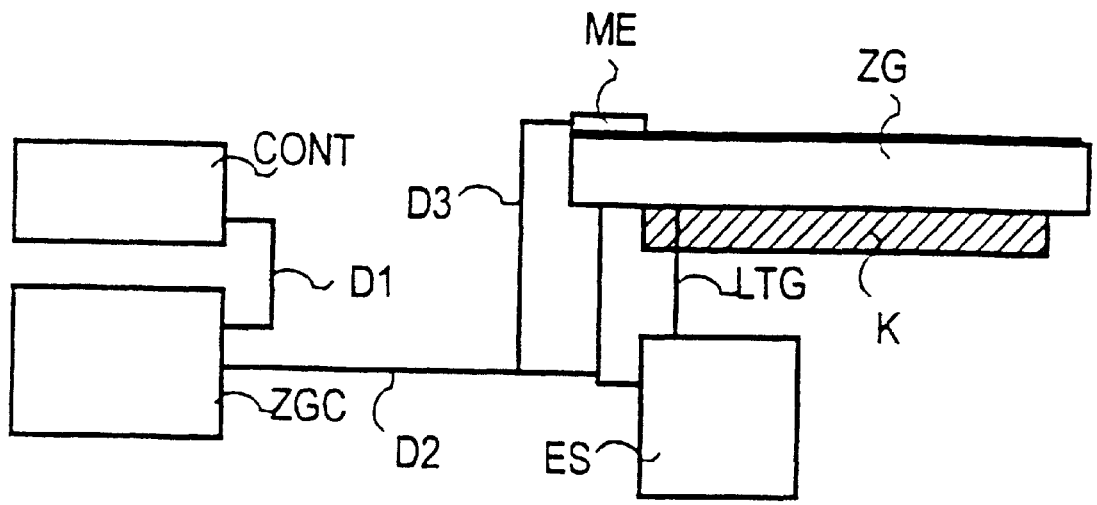
FIG. 1 is a block illustration of a character generator with a power supply and a control.

According to FIG. 1, an optical character generator ZG of an electrographic printer or copier devices is connected to a controller CONT of a character generator control ZGC and to a power supply ES. Image information encoded in a known printer language such as, for example, IPDS, PCL, or POSTSCRIPT are converted in the controller CONT into a raster of individual picture elements, what is referred to as a bitmap. This bitmap is transmitted to the character generator control ZGC via a first data bus having a width of 32 bits. Optionally, the transmission can also ensue with other bus widths or with a serial bus.

The character generator control ZGC controls all functions of the character generator ZG. The information of the bitmap is thereby converted into a turn-on information for each individual light source LED that is matched to the components of the character generator ZG. Below, the light-emitting diodes LED that serve as light sources in the character generator ZG shall be referred to with the abbreviation LED. These LED-specific turn-on information are transmitted to the character generator ZG from the character generator control ZGC via a second data bus D2. The width of the second data bus D2 is dependent of the transmission rate, which varies with the length of the character generator ZG, with the image resolution in dpi (dots per inch), the printer speed and the number of gray scale or color gradations. In the present example, the print format resolution amounts to 600 dpi and the number of illumination steps connected to the gray-scale steps amounts to 256. Following the number of illumination steps, each LED on the character generator ZG must be supplied with a byte having the width of 8 bits as on-duration information.

Figure 2:
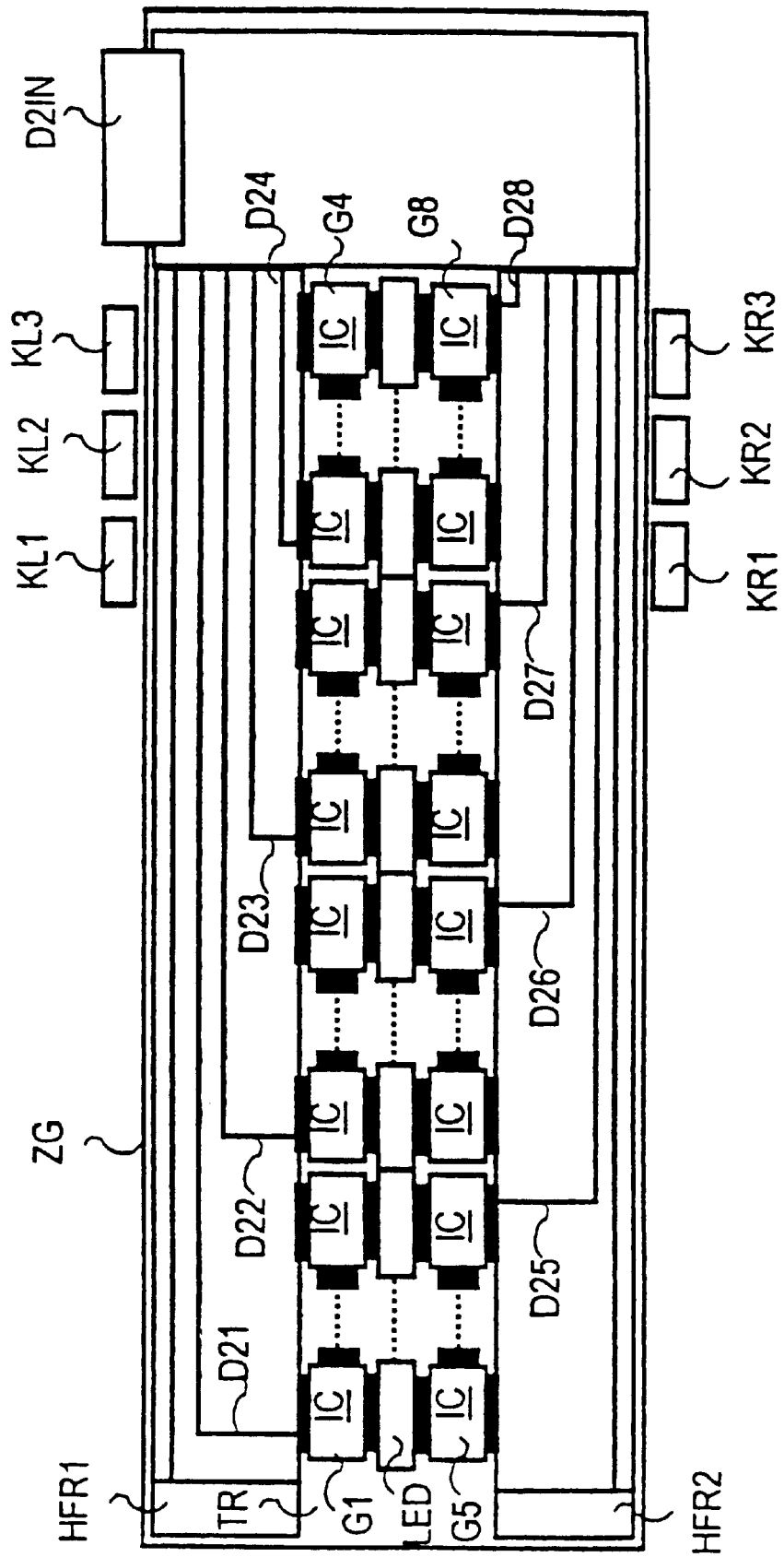
FIG. 2 is a schematic illustration of the character generator in plan view, with a carrier and a flat module.

As proceeds from the plan view of FIG. 2 onto the character generator ZG, the character generator ZG contains eight groups G1 . . . G8 of LEDs that are respectively connected to an 8-bit wide data line D21 . . . D28 of the second data bus D2. The overall width of the second data bus D2 thus amounts to 64 bits. This second data bus D2 is connected to a data input D2IN of the character generator ZG. The data proceed via this data input D2IN to a flat module FBG (see FIGS. 6 and 7) of the character generator ZG. On the flat module FBG, the data lines of the second data bus D2 are divided into individual, group-specific data lines D21 . . . D28 and are respectively conducted to the input of an integrated circuit IC that serves as a means for the control of the LED. This integrated circuit IC respectively forms the first of a plurality of means for the control of the LEDs that are combined in the eight groups G1 . . . G8. The flat module FBG can contain amplifier means that effect a signal amplification of the data on the second data bus D2.

The flat module FBG contained in the character generator ZG serves not only for supplying signals but also for supplying energy to the control means. As needed, the flat module FBG can also assume the energy supply to the LEDs. The energy is supplied to the character generator by a power supply ES that is connected to the character generator via a line connection LTG. To that end, the connecting line LTG is connected to terminals KL, KR respectively provided at the long sides of the character generator. The ground connection GND ensues at the terminals KL1, KR1; a voltage of 3.1 Volts is adjacent at the terminals KL2, KR2; and a voltage of 5.4 Volts is adjacent at the terminals KL3, KR3. The amount of these voltages is dependent on the technology employed in the integrated circuits IC and in the LEDs.

As can also be derived from FIG. 2, the LEDs are arranged centrally in the longitudinal extent of the character generator ZG, being arranged on a carrier TR in a row that forms a printing line. The number of LEDs per unit of length corresponds to the number of picture elements per unit of length. When the number of picture elements per unit of length corresponds to 600 dpi then 600 LEDs are correspondingly arranged in a row over this distance. The one-row arrangement of the LEDs has the advantage that a potential repair of the character generator is facilitated. The LEDs cannot be arranged side-by-side as discrete elements but are combined in sections on a semiconductor chip of gallium arsenide. 64 LEDs are arranged on a semiconductor chip. Such a semiconductor chip is referred to as an LED array below. The LED arrays have a rectangular shape and are glued directly onto the carrier TR.

A respective integrated circuit IC, which is likewise directly glued onto the carrier, is arranged at both sides of each LED array. The fastening of the components can also optionally ensues with a conductive adhesive, with a solder or the like. As can be derived from FIGS. 6 and 7, a wing of the flat module FBG adjoins that side of each IC facing away from the LED array. The flat module FBG extends from the end face of the character generator ZG at which the data terminal D21N is provided in two wings at both sides of the LED arrays and ICs arranged on the carrier TR. Due to the high data rate, that end of each wing of the flat module FBG facing away from the data input D2IN is terminated with a terminating impedance HFR1, and HFR2.

Figure 6:
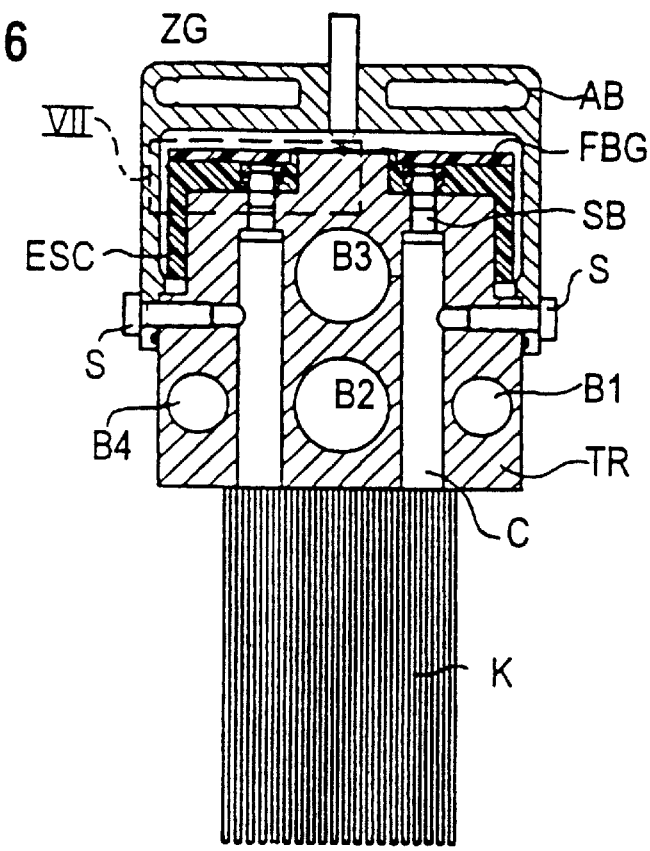
FIG. 6 is a sectional view of the character generator with a section perpendicular to its longitudinal extent.

The further structure of the character generator ZG can be seen in the sectional view of FIG. 6. The shape of the carrier TR is essentially rectangular. The carrier TR is composed of metal that is provided with longitudinal bores B1 . . . B4 for enhancing the longitudinal stiffness and/or for the purposes of a water cooling. At its underside, the carrier TR is coupled to a cooling member K. The flat module FBG, the ICs and the LED arrays are arranged at that upper side of the carrier TR lying opposite the cooling member K. This upper side is upwardly shielded by a covering AB. The covering AB is implemented hood-like and partially embraces the carrier TR. Legs of the covering lying against the sidewalls of the carrier TR are detachably fixed to the carrier TR with screw-type connections S. In its part extending on the upper side of the carrier TR, the covering AB is implemented as a hollow profile that contains what is referred to as a selfog lens in the radiation area of the LED for focussing the LED emission.

Figure 7:
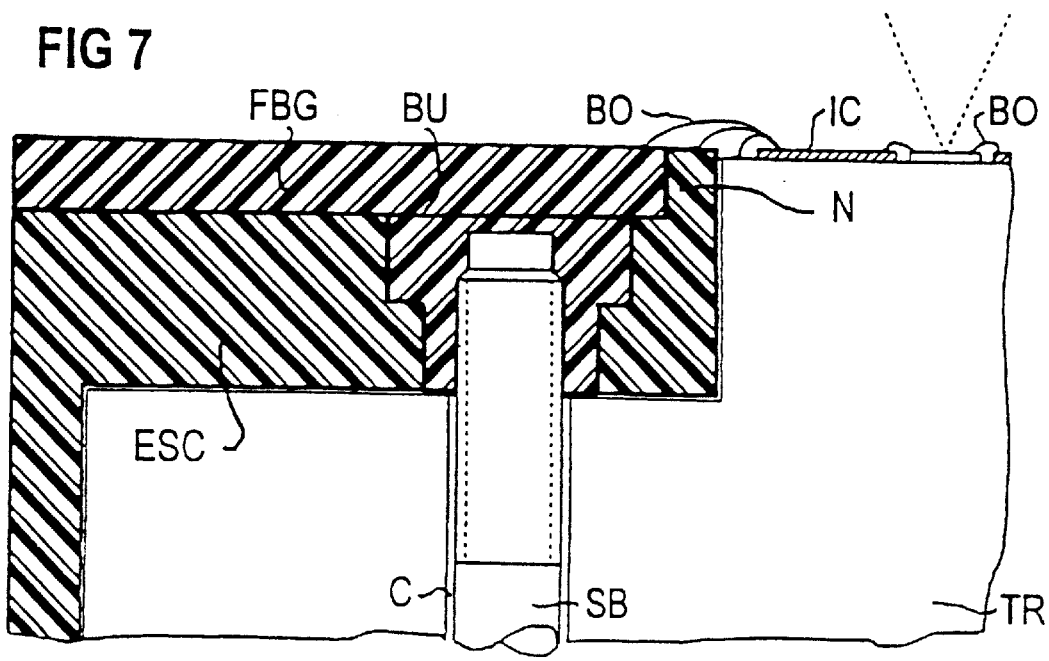
FIG. 7 is an enlarged excerpt from the sectional view of FIG. 6 with a busbar, a flat module and a carrier.

As can be particularly derived from the detailed illustration of FIG. 7, the upper part of the carrier TR is supplemented by a busbar ESC and the flat module FBG to form a rectangular crossectional shape. The busbar ESC exhibits an L-shaped profile that can be placed into a corresponding recess of the carrier TR. An insulator (not shown) is introduced between the carrier TR and the busbar ESC in order to prevent an electrical connection between the two component parts. Along its extent, the busbar ESC comprises a plurality of clearances C into which electrically non-conductive threaded bushings BU can be introduced from the side facing away from the carrier TR. Screws SB that can be introduced through the clearances C proceeding between upper side and underside of the carrier TR penetrate into these threaded bushings BU for fastening the busbar ESC to the carrier SB. This type of fastening between the carrier TR and the busbar ESC exhibits the advantage that the flat module FBG embedded into the busbar ESC on the upper side of the carrier TR is not negatively influenced by the type of fastening. Thus, no attention need be paid to potential penetrations for fastening the busbar ESC in the laying of the interconnects on the flat module FBG.

The flat module FBG is embedded into a recess on the upper side of the busbar ESC that corresponds to the crossection of the flat module FBG. The flat module FBG is connected to the busbar ESC surface-wide. In particular, a planar gluing with an electrically non-conductive adhesive is suitable therefor. As a result of the surface-wide connection between the two component parts, the longitudinal rigidity achieved by the L-shape of the busbar is also utilized for the flat module FBG extending, for example, over a length of about 70 cm.

A part of the surface of the carrier TR on which the LED arrays together with their two respectively neighboring ICs are applied in the above-described way remains between the busbars ESC proceeding at the long sides of the carrier TR. The carrier TR thereby serves as a ground line that is contacted by the conductive gluing to the integrated circuits IC and the LED arrays. The electrical connections required between the integrated circuits IC and the LED arrays are directly produced by bond connections BO conducted from a contact surface of the IC to a contact surface of the LED array. The electrical connections between contacts of the flat module FBG and of the busbar ESC to the integrated circuit IC are also implemented by the same kind of bond connections BO. The ground connection from the carrier TR to the IC and/or to the LED array can also be optionally produced by bonding BO. In order to enable a bond connection BO between the busbar ESC and the IC, the busbar ESC comprises a contact, nose or projection, N that extends from a leg of the busbar ESC perpendicular thereto in the direction of the upper carrier side. The contact nose N extends along the upper carrier side on which the ICs and LED arrays are arranged and is thus located between the flat module FBG and the upper carrier side. The bonding BO can be implemented with what is referred to as the Wetch process on the basis of an appropriate coating of the surface of the contact nose N.

Figure 4:
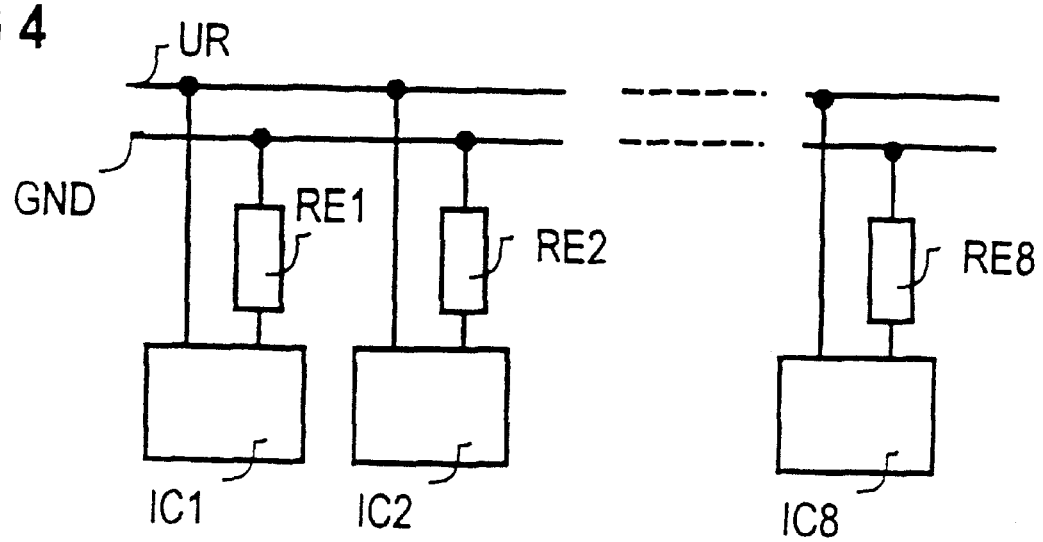
FIG. 4 is a block circuit diagram of the connection of reference resistors to the means for controlling light sources.

Employing bond connections BO from the flat module FBG to the IC discloses a simple possibility for connection with which an arrangement of smoothing capacitors and reference resistors RE1 . . . RE4 (see FIG. 4) can be realized on the flat module FBG in a simple way. Lower tolerance values of the components can be achieved on the basis of such discretely equippable components. A high quality of the exposure of a photoconductive material such as, for example, a photoconductive drum implemented with the character generator ZG can be achieved with low tolerance values.

The data are brought to the respectively first IC via the flat module FBG by the data lines D21 . . . D28 of the second data bus D2(see FIG. 2). The connection between the data lines D21 . . . D28 and the integrated circuits IC ensues with the bond connections BO (see FIG. 7). The ICs contain shift registers SR (see FIG. 3) through which the data are shifted. The output of the shift register SR is respectively directly coupled to the input of the shift register SR of the following IC by a bond connection BO. Given a word width of 8 bits, accordingly, 8 bond connections BO with a total of 16 contacts are required. Compared to an indirect connection of the shift registers SR via the flat module, thus, 16 contactings and 8 interconnects are eliminated on the flat module FBG per shift register connection. This increases the dependability of the character generator and reduces its structural size. This produces an enhancement of the manufacturing quality and of the yield of faultless flat modules FBG in the fabrication.

In the illustrated embodiment, two ICs are allocated to each LED array. 128 LEDs are contained in each LED array, the even-numbered LEDs thereof being driven by the IC of a first group G1 . . . G4 (see FIG. 2) and the odd-numbered LEDs thereof being driven by an IC of another group G5 . . . G8. Each integrated circuit IC thus drives 64 LEDs. Consequently, 64 data words of 8 bits each can be processed in an IC.

Figure 3:
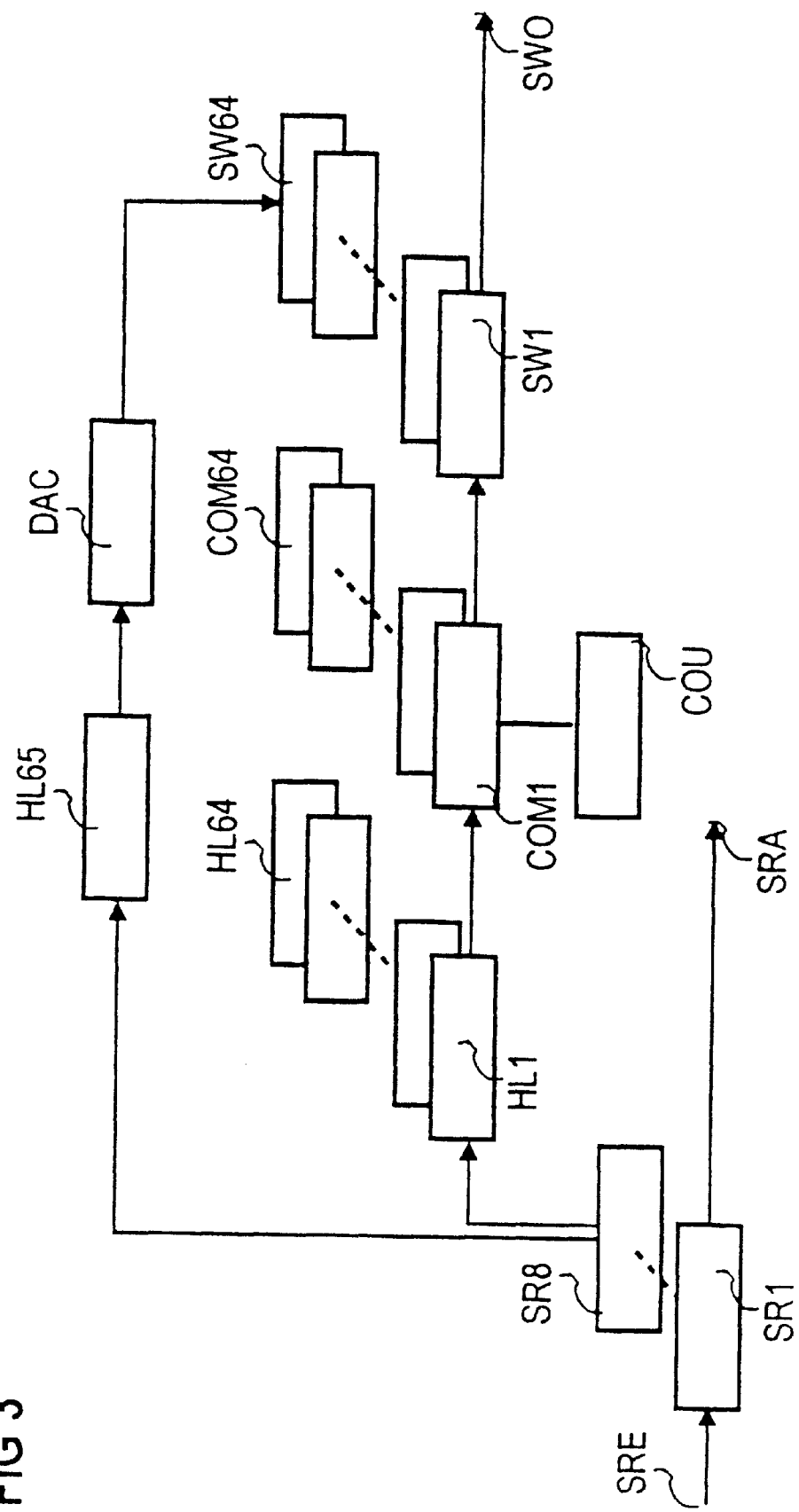
FIG. 3 is a block illustration of the function elements of a means for controlling light sources.

FIG. 3 shows a block illustration of the function elements of an IC. The data input SRE of the IC is formed by the shift register input SRE having a width of 8 bits. Each bit is supplied to one of 8 parallel shift registers. The shift register length amounts to 64 bits, as a result whereof the first bit is handed over to the following IC via the shift register output SRA when the $65^{th}$ bit is written in. 64 data words for the control of the on time of 64 LEDs are thus available in the IC at the end of the shift event.

Since it is not only an individual control of the on time of each LED of a group of LEDs but also an average energy supply for all LEDs of this group that is to be set by the IC, the IC contains a digital-to-analog converter DAC with whose assistance the average energy supply to the LEDs can be set. The energy supply to be set is supplied to this digital-to-analog converter DAC in the form data word that, for example, has a width of 6 bits. The feed can, on the one hand, ensue with a separate data bus or, on the other hand, especially advantageously as a data word within the image data stream. Given this latter embodiment, a corresponding length of 65 bits is to be selected for the shift registers SR1 . . . SR8.

65 intermediate memories HL1 . . . HL65 into which the 8-bit wide data words are transferred in parallel from the shift registers SR1 . . . SR8 are provided as first function stage following the shift registers SR1 . . . SR8. Correspondingly, one data word is transferred into the intermediate memory HL65 intended for the digital-to-analog converter DAC.

8-bit comparators COM1 . . . COM64 are provided as second function stage, following the intermediate memories HL1 . . . HL64. The comparators COM1 . . . COM64 compare the data word deposited in the respectively appertaining intermediate memory HL1 . . . HL64 to the counter reading of a counter COU that is coupled to all comparators COM1 . . . COM64. The count clock is externally supplied. This external supply leads to a simple programmability of the clock generator. When the counter reading, proceeding from a start signal for the exposure and the counter reading of 0 accompanying this, reaches the value stored in the intermediate memory HL1 . . . HL64, then the 1-bit output information of the comparator COM1 . . . COM64 changes with the next counting step.

As third function unit of the IC, 64 analog switch means SW1 . . . SW64 follow the comparators COM1 . . . COM64. These switch means SW1 . . . SW64 are controlled by the output information of the comparators COM1 . . . COM64. Dependent on the individual data word, the individual LEDs are activated with the beginning of the counting event by the switch means SW1 . . . SW64 of the IC respectively allocated to them. For example, an LED is not activated given a data word with the value 0, whereas the appertaining LED is activated given a data word having the value 150. The counter COU reaches the counter reading 150 and the comparator COM1 . . . COM64 generates a 1-bit wide signal when changing to the counter reading 151 that effects a deactivation of the corresponding LED with the switch means SW. The output SWU of each switch means is conducted to a contact surface of the IC on which the bond connection BO to the LED can ensue.

Figure 5:
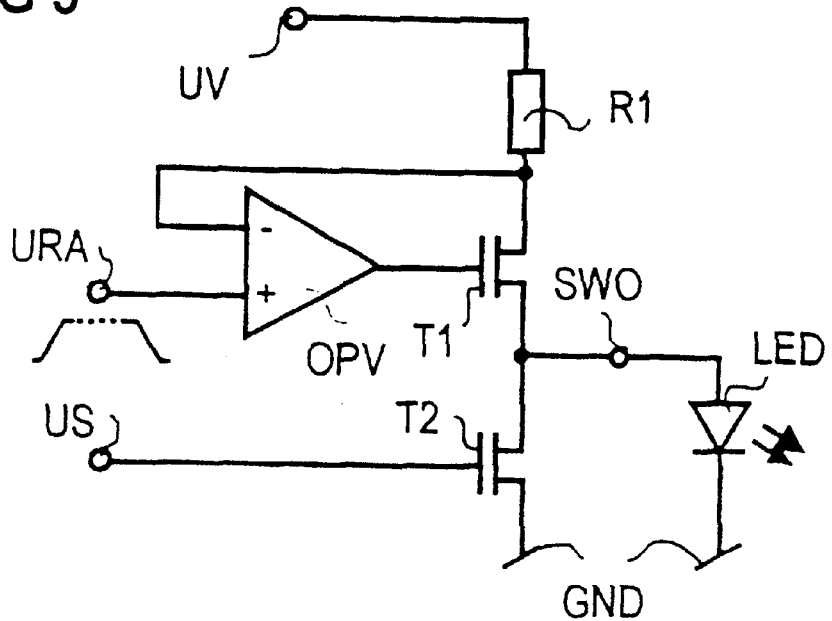
FIG. 5 is a circuit diagram of a ramp circuit for the activation of light sources.

The current delivered to the LED during the on time is determined by the digital-to-analog converter DAC. According to FIG. 4, a reference voltage UR is supplied to the digital-to-analog converter DAC. The digital-to-analog converter DAC is also connected to a reference resistor RE1 . . . RE8 arranged on the flat module FBG and connected to ground and at one side. A reference current that is mirrored into the driver transistors T1 of the switch means SW1 . . . SW64 is generated with the assistance of this reference resistor RE1 . . . RE8. A temperature compensation can be achieved in this way with the assistance of a corresponding temperature coefficient of the reference resistor RE1 . . . RE8. A driver stage of the switch means SW1 . . . SW64 is shown in FIG. 5. The driver stage is fashioned as what is referred to as a ramp circuit and is composed of an operational amplifier OPV whose output is connected to the control input of the driver transistor T1. The driver transistor T1 is disclosed as a field effect transistor of a specific polarity. However, a field effect transistor of a different polarity as well as a transistor of a different technology such as, for example, a bipolar transistor could also be employed. The drain input of the driver transistor T1 is connected, on the one hand, to the inverting input of the operational amplifier OPV and, on the other hand, to a terminal of a load resistor R1. The other terminal of the load resistor R1 is connected to the supply voltage UV. The source terminal of the driver transistor T1 forms the switch means output SWO. The anode of the LED is connected to this switch means output SWO. The cathode of this LED lies at ground GND.

The drain-source path of a shunt transistor T2 lies parallel to the LED. The control input of this shunt transistor T2 is coupled to the input OS for switching the LED.

Voltage disturbances can be avoided with the described ramp circuit. Since the LEDs of all LED arrays are arranged on a line, they must be simultaneously activated. A high aggregate current flows in this simultaneous turn-on event. Inductivity problems involving the bus bar ESC arise due to this high current surge. These problems are avoided with the ramp circuit because the current can be "revved up" relatively slowly and controlled and a fast activation of the LEDs is nonetheless assured. Before the LEDs are activated, the current is run up with predefined current rise rates until the desired LED value of the current flows through the shunt transistor T2 connected parallel to the LED. The current is specifically set with the described current mirror IC. The shunt transistor T2 is deactivated after the current flows in a stable fashion. The current now flowing through the LED now has the same value as the previous current through the shunt transistor T2. The turn-off event proceeds analogous to the turn-on event that has just been described. Due to the activation of the shunt transistor T2, the current—which is unvaried in value—no longer flows via the LED. The current is then "run down" to the value 0 with a predetermined drop rate. Since the current does not exhibit a steep edge at any point in time, undesirable noise voltages can also not be generated. The edge rise is set by a ramp voltage URA that is adjacent at the non-inverting input of the operational amplifier OPV. The effect of avoiding noise voltages that can be achieved with the ramp circuits can be improved in that neighboring shunt transistors are switched offset in time relative to one another.

Figure 8:
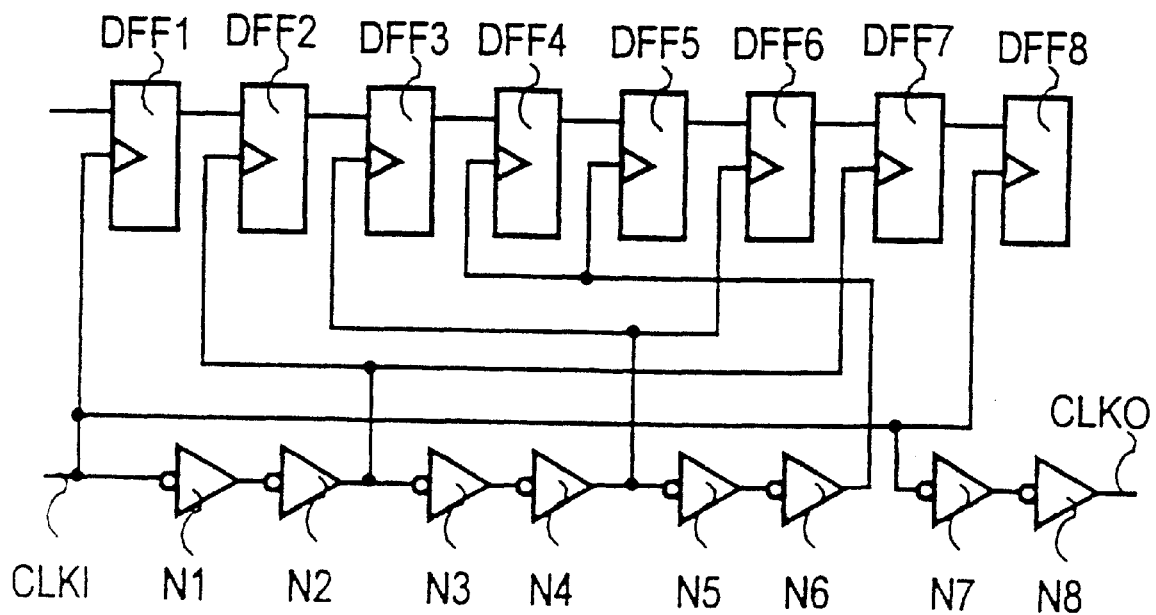
FIG. 8 is a block circuit diagram of a clock supply of the data memory in the fashion of a shift register.

FIG. 8 shows a specific clock supply of the data memory in the fashion of a shift register SR1 . . . SR8. The clock supply described below reduces the switching noise that would occur in a conventional clock supply, without causing a significant retardation of the signal running time.

Individual D-flipflops are connected in series in the inside of the shift registers SR1 . . . SR8. Given a register length of 65 bits, 65 D-flipflops are correspondingly required. These D-flipflops are divided into groups of, for example, 8 D-flipflops DFF1 . . . DFF8. Within these groups, the first and the last D-flipflop DFF1, DFF8 are supplied with the clock signal CLK1 adjacent at the input of the shift register group. The input clock is delayed by two series-connected inverters N1, N2. The clock signal delayed in this way is supplied to the second and seventh D-flipflop DFF2, DFF7. A further delay of the clock signal ensues with the series-connected inverters N3, N4. This additionally delayed clock signal is supplied to the third and sixth D-flipflop DFF3, DFF6. The fourth and fifth D-flipflop DFF4, DFF5 are supplied by a clock signal additionally delayed by the series-connected inverters N5, N6. The clock signal adjacent at the clock input CLK1 is not immediately supplied to a clock output CLKO but is output to the next-following register group delayed via two further inverters N7, N8. This last-cited delay by the inverters N7, N8 assures that the clock signals for different register groups are also time-offset relative to one another.

The data that are clocked through the shift registers SR1 . . . SR8 are transmitted from the flat module FG to the respectively first IC of a group. The data words are generated in the character generator control ZGC and are transmitted to the flat module FBG of the character generator ZG via the second data bus D2(see FIG. 1). So that the data words generated in the character generator control ZGC can be formed dependent on the individual luminous intensity of an LED, a correction information with respect thereto must be identified at specific time intervals. A measuring means ME that identifies the individual luminous intensities is utilized for this purpose. Such a measuring means is disclosed by U.S. Pat. No. 4,780,731. It comprises a measurement carriage on which light-sensitive sensors are arranged. Using the carriage, the sensors are conducted across the LED line of the character generator and the individual luminous intensity of each LED is determined by an appropriate control. The identified data are conducted via a third data bus D3 (FIG. 1) to the character generator control ZGC for further processing. For example, this data bus is 10 bits wide. The character generator control ZGC directly processes these data and produces a table with correction values therefrom. However, this data processing can also ensue outside the printer with appropriate data processing means. The corresponding tables must then be subsequently loaded into the character generator control ZGC, so that these can be operated with the gray scale or color information supplied by the controller CONT for operation. The data words in the form of an on-duration byte are generated from this operation and transmitted to the character generator.

The data transmission to the individual IC groups ensues in parallel. The data words are clocked through the shift registers SR of the ICs until the first data word has reached the last register of the last IC of a group. The data words are then transferred in parallel into the intermediate memories HL (see FIG. 3). This transfer is followed by the beginning of the next data transmission cycle wherein the next line to be printed is clocked into the shift registers SR. While the next data transmission cycle is sequencing, the individual LEDs are activated in the above-described way for a specific time dependent on the individual data word. The counter COU employed therefor can be clocked by an oscillator (not shown) that can be arranged in the character generator ZG or in the character generator control ZGC.

The disclosed character generator ZG can also comprise a lesser scope. For example, this character generator ZG can thus comprise only two IC groups and thereby retain the full, described functionability. It can also be utilized with only one IC per LED array. Given an unmodified length, such a character generator ZG serves for the reproduction of a lower-resolution print image information or, given an unaltered, high resolution of, for example, 600 dpi, its length is reduced. A plurality of character generators of reduced length can be joined module-like to form a character generator ZG of increased length. It is thus possible to utilize this character generator ZG in various printer or copier devices with unmodified structure, even when these devices process recording media with different widths.

Given less stringent demands, the above-described type of busbars ESC that conduct the current to the LEDs can be foregone. These busbars ESC can then be implemented as inner layer of the flat module FBG.

Although other modifications and changes may be suggested by those skilled in the art, it is the intention of the inventors to embody within the patent warranted hereon all changes and modifications as reasonably and properly come within the scope of their contribution to the art.

What is claimed is:

1. An optical character generator for an electrographic printer or copier device, comprising
   a plurality of controllable light sources arranged in at least one row, said plurality of controllable light sources being divided into even-numbered and into odd-numbered groups;

a plurality of groups of control means for controlling said plurality of controllable light sources;

a character generator control connected to said plurality of groups of control means to supply in parallel data comprising a plurality of bits and corresponding to illumination stages of individual ones of said controllable light sources;

said plurality of groups of control means being provided for both the even-numbered groups of light sources and the odd-numbered groups of light sources, individual ones of said control means being arranged successively within the groups of control means, an electrical bond connection directly coupled from an output to an input of successively arranged ones of said control means, and a data input connected only to an input of a first successively arranged one of said control means, said control means at said data input including:

a parallel shift register arrangement whose bit width corresponds to a bit width of the input data, an intermediate memory connected to said parallel shift register arrangement to receive the data in parallel;

a carrier on which said plurality of controllable light sources and said control means are arranged; and conductors directly electrically coupling said plurality of controllable light sources and said control means to one another.

2. An optical character generator according to claim 1, wherein said control means;

sets an average energy supply for all of said plurality of controllable light sources of a group, and enables an individual control of on time of each of said plurality of controllable light sources of a group.

3. An optical character generator according to claim 2, further comprising:

an integrated circuit in which said control means is integrated, said control means including a data memory being a shift register into which data for individual control of on time of each of said controllable light sources is serially written;

an intermediate memory into which the data of the data memory is written in parallel;

switch means that switch an energy supply of individual ones of said controllable light sources dependent on respective data available in the intermediate memory; and wherein said function of setting an average energy supply is performed by means for setting an average energy supply that is coupled to a further intermediate memory serving as a correction value memory.

4. An optical character generator according to claim 3, wherein said means for setting an average energy supply includes a digital-to-analog converter connected to receive a predetermined reference voltage, said digital-to-analog converter deriving a control voltage from said predetermined reference voltage dependent on a correction value obtained from said correction value memory, an external resistor connected to said integrated circuit to convert the control voltage into a control current.

5. An optical character generator according to claim 4, wherein said data memory is a shift register that includes an expanded memory location for the correction value for the digital-to-analog converter.

6. An optical character generator according to claim 3, further comprising:

a succession of said integrated circuits, such that an output of a respective one of said shift registers is directly electrically coupled by bonding to an input of a successively arranged one of said shift registers, and data are externally supplied only to the shift register of a first of said integrated circuits.

7. An optical character generator according to claim 3, wherein said data memory includes a plurality of clock-controlled individual memories forming respective groups of successively connected individual memories at least said successively connected individual memories arranged at an input side and an output side changing their status isochronically and said successively connected individual memories respectively lying farther toward an inside then changing their status.

8. An optical character generator according to claim 3, wherein said switch means includes a switchable circuit element parallel to said controllable light sources so that energy supply to said character generator ensues independently of activation of said controllable light sources.

9. An optical character generator according to claim 8, wherein said switchable circuit element includes a shunt transistor for each of said controllable light sources, neighboring ones of said shunt transistors being switched offset in time relative to one another.

10. An optical character generator according to claim 2, wherein said control means controls the average energy supply dependent on predetermined boundary conditions.

11. An optical character generator according to claim 2, wherein said control means controls individual on time of each of said controllable light source dependent on a specific luminous intensity of said controllable light sources and on a gray scale information reproduced with said controllable light source.

12. An optical character generator according to claim 1, wherein said plurality of controllable light sources are light-emitting diodes, said light-emitting diodes (LED) being combined in groups as respective LED arrays, said light-emitting diodes being arranged in a row on a rectangular semiconductor chip such that an LED line is formed of a plurality of LED arrays adjoining one another.

13. An optical character generator according to claim 12, wherein said LED arrays include sub-groups formed by even-numbered and odd-numbered light-emitting diodes, and ones of said control means being allocated to each of said sub-groups.

14. An optical character generator according to claim 1 further comprising:

a distributor flat module arranged on said carrier and coupling said character generator control to said control means.

15. An optical character generator according to claim 14, further comprising:

busbars formed as inner layers of said distributor flat module to deliver current directly to said integrated circuit.

16. An optical character generator according to claim 14, further comprising:

a busbar on said carrier serving as a ground line for a ground connection to said controllable light sources.

17. An optical character generator according to claim 16, wherein said busbar is angled off L-shaped in a direction of its longitudinal extent, and said distributor flat module is glued onto the busbar.

18. An optical character generator according to claim 17, wherein said busbar defines at least one recess including a thread, said carrier defining an opening, a screw guided through said opening of said carrier and screwed into said at least one recess in said busbar.

19. An optical character generator as claimed in claim 1, wherein said optical character generator includes at least two character generators connected to one another module-like.

20. A method for operating an optical character generator for an electrographic printer or copier device, comprising the steps of:

provided a plurality of controllable light sources arranged in a least one row;

controlling said plurality of controllable light sources with a switch for each of said controllable light;

driving a driver stage of the switch at least one of before activation and after deactivation of said controllable light sources such that a flow of current through a switchable component connected parallel to said controllable light sources is temporarily generated at an output of said driver stage so that energy supply to the character generator temporarily ensues independent of activation of said controllable light sources;

generating the flow of current at an output of the driver stage through the parallel connected component, the flow of current rising relatively slowly up to a predetermined amount; and activating one of said controllable light sources by shutting off the parallel connected component so that the flow of current through the controllable light source assumes the predetermined amount relatively quickly for activating the light sources.

21. A method according to claim 20, further comprising the step of:

controlling the flow of current.

22. A method according to claim 21, wherein said controlling step ensues via a control voltage from said driver stage that has a ramp curve.

23. A method according to claim 22, further comprising the step of:

applying the control voltage to an input of the operational amplifier.

24. A method according to claim 21, further comprising the step of:

varying the flow of current slowly.

25. A method according to claim 20, further comprising the steps of:

for deactivating the controllable light sources, turning on the parallel connected component at the output of the driver stage so that the current previously flowing through the light source flows through the component after a relatively short time; and subsequently dropping the current flowing through the component slowly with a predetermined characteristic.

26. A method according to claim 20, further comprising the steps of:

allocating a parallel component to each light source; and switching neighboring parallel components with time offset relative to one another.

27. A method according to claim 20, further comprising the steps of:

providing an operational amplifier as the driver stage whose output is connected to a control output of a first transistor for switching; and conductively connecting a second transistor to the first transistor as the parallel connected component.

* * * * *